United States Patent [19]

Glemza

[11] 4,260,396
[45] Apr. 7, 1981

[54] COMPOSITIONS FOR POLISHING SILICON AND GERMANIUM

[75] Inventor: Rimantas Glemza, Baltimore, Md.

[73] Assignee: W. R. Grace & Co., New York, N.Y.

[21] Appl. No.: 869,402

[22] Filed: Jan. 16, 1978

[51] Int. Cl.³ .............................................. C09K 3/14
[52] U.S. Cl. .................................. 51/298; 51/281 R; 51/302; 51/308; 106/3; 106/5
[58] Field of Search ................. 51/300, 302, 308, 303, 51/298, 304, 281 R; 106/5, 6, 3, 209, 208

[56]  References Cited
U.S. PATENT DOCUMENTS

| | | | |
|---|---|---|---|
| 2,765,223 | 10/1956 | Candee et al. | 51/304 |
| 3,275,460 | 9/1966 | Jeanneret | 106/209 |
| 3,428,464 | 2/1969 | Pollard | 106/209 |
| 3,455,705 | 7/1969 | Rusher | 106/209 |
| 3,462,251 | 8/1969 | Whalen | 51/304 |
| 3,619,962 | 11/1971 | Combe | 51/304 |
| 3,817,727 | 6/1974 | Yancey | 51/298 |
| 3,821,008 | 6/1974 | Jordan et al. | 106/209 |
| 3,966,432 | 6/1976 | Rayner | 106/3 |
| 4,038,048 | 7/1977 | Thrower | 51/298 |
| 4,057,939 | 11/1977 | Basi | 106/3 |

*Primary Examiner*—Donald J. Arnold
*Attorney, Agent, or Firm*—Mark T. Collins

[57]  ABSTRACT

A composition for polishing silicon and germanium comprises a synthetic amorphous silica polishing agent and a suspending agent selected from the group consisting of water-soluble carboxypolymethylene gums and xanthum gums. The composition may be used for polishing in the form of an aqueous alkaline slurry.

33 Claims, No Drawings

COMPOSITIONS FOR POLISHING SILICON AND GERMANIUM

This invention relates to the polishing of silicon and germanium, such as crystal wafers polished for use in semiconductors.

Silicon wafers, and to some extent germanium wafers, are widely used as the supporting crystals in semiconductor devices for transistors and other electronic equipment. Very thin wafers having thicknesses of only 0.005 to 0.030 of an inch are sliced from ingots of silicon or germanium crystal and polished to produce as planar a surface as possible since any surface defects affect the electrical conductivity of the wafers.

A slurry of a polishing agent in water is applied to the surface and the polishing effected with a polishing pad. Silica is a preferred polishing agent because it gives a surface which is substantially free from defects. In U.S. Pat. No. 3,170,273 to Walsh et al., silica sols having silica concentrations from 2 to 50% and silica gels having silica concentrations from 2 to 100% by weight are used to polish silicon and germanium crystals and other semiconductor materials. The ultimate particle size of the sols and gels may range from 5 to 200 millimicrons.

U.S. Pat. No. 3,328,141 to Lachapelle discloses that the speed of polishing crystalline silicon is increased when an alkaline compound is combined with the polishing agent in the presence of water as a suspending agent to bring the pH to at least about 10 and preferably from 10.5 to 12.5. Silicon dioxide is disclosed as a suitable polishing agent and oxides, hydroxides, and strongly alkaline salts of alkali and alkaline earth metals are disclosed as alkaline compounds. The metal ions in the alkaline compound may be detrimental to electronic grade silicon and germanium. In addition to metal hydroxides and strongly alkaline salts, U.S. Pat. No. 3,715,482 to Tredinnick et al. discloses the use of ammonium hydroxide. However, the quantity of ammonium hydroxide necessary to provide a pH greater than 10 for rapid polishing rates results in an unacceptable ammonia odor unless special venting equipment is used.

After more than about a week from the time of preparation, the silica will settle out of the slurry and the polishing composition develops a greater tendency to scratch than a freshly prepared slurry, possibly due to agglomeration of the silica. In the Tredinnick et al. patent, alkaline aqueous silica polishing compositions having a reduced tendency to scratch silicon and germanium surfaces after storage are disclosed. A water-soluble cellulose derivative is used to inhibit settling of the silica. The patent notes that even small amounts of the cellulose derivative cause the slurry to become unduly viscous and slow the polishing rate.

The present invention provides a composition for polishing silicon and germanium surfaces comprising a synthetic amorphous silica polishing agent and a suspending agent selected from the group consisting of water-soluble carboxypolymethylene gums and xanthum gums. The composition can be readily dispersed in water with an alkaline compound to form slurries of varying concentrations and pH's. Even at high solids loadings, the slurries are readily pumpable and the polishing agent remains in suspension after storage for periods of three months or longer. The slurries provide rapid polishing rates and hazefree, highly smooth silicon and germanium surfaces. An organic amine base is preferably employed as the alkaline compound to provide more rapid polishing and surfaces free of metal contamination.

The compositions of this invention may be used to polish any silicon or germanium surface but are especially adapted for the polishing of crystals and crystalline wafers of silicon and germanium.

Synthetic, amorphous silicas are used in the polishing compositions of this invention and include, for example, silica hydrogels, silica aerogels, silica xerogels, and precipitated silica. A variety of synthetic amorphous silicas are commercially available and their methods of preparation are well known in the art. The polishing agent is preferably finely divided and has an average particle size of less than about 30 microns and especially of from about 1 to about 15 microns.

A preferred type of synthetic amorphous silica is a silica hydrogel because it provides rapid polishing and an excellent surface. Silica hydrogel may be prepared by adding a mineral acid, such as sulfuric acid, to an agitated sodium silicate solution until a pH of less than about 5 and commonly of between 1 to 3 RG Jan. 13, 1978 is reached to form a silica sol. The alkali silicate solution commonly has an $SiO_2$ concentration of 6 to 20 percent by weight. The sol is allowed to set the hydrogel and washed to free it of electrolytes. The washed hydrogel may then be ground to the desired particle size and dried by oven drying, fluid energy milling, spray drying, flash drying or some other known method. The silica concentration, temperature, and pH of the reaction, the temperature, pH, and time of washing, and the rate of drying affect the gel properties such as density, surface area, and pore volume.

Generally, the silica hydrogen polishing agents contain at least about 50 weight percent water, as measured by loss on ignition, and preferably contain from about 55 to about 75 weight percent water. The porous structure of the hydrogel absorbs the abraded silicon and germanium and thus exposes new surfaces for polishing. The present invention thus provides a method of polishing silicon and germanium surfaces comprising polishing the surface with an aqueous slurry of a silica hydrogel.

The polishing compositions of this invention also include a water-soluble gum as a suspending agent. A gum is a hydrophilic material that can be dissolved or dispersed in water to give viscous or mucilaginous solutions or dispersions. The suspending agents of this invention provide relatively high viscosity slurries at relatively low concentrations and thus reduce the specific gravity difference between the solid phase and the liquid phase of the slurry and the relative flow between these phases.

However, these suspending agents also provide plastic flow aqueous slurries which do not flow until the applied shear stress exceeds a certain minimum value which is known as yield value. The suspending effect is predominantly supplied by the significant yield values of slurries containing relatively low concentrations of the suspending agent. Since yield value is non-directional, it causes the slurry to resist particle movement and sedimentation.

As discussed in Bowles et al., "A Method for the Interpretation of Brookfield Viscosities", *Modern Plastics* (Nov. 1955), herein incorporated by reference, yield value can be approximated with the Brookfield RVT Viscometer using the equation:

$$\text{Brookfield Yield Value} = \frac{\text{Apparent Viscosity at 0.5 rpm} - \text{Apparent Viscosity at 1 rpm}}{100}$$

Because of their ability to impart significant yield value, i.e. initial resistance to flow under stress, the suspending agents produce slurries that are stable yet offer low resistance to manipulation and flow easily under slight pressure such as in pumping or polishing where the yield value is exceeded. The stability of the slurry may be controlled by selection of the yield value. See, Meyer et al., "The Rheology of Natural & Synthetic Hydrophilic Polymer Solutions as Related to Suspending Ability", *Journal of the Society of Cosmetic Chemists*, Vol. X, No. 3 (May, 1959), herein incorporated by reference. The yield value is selected to provide slurries having acceptable pumping and polishing rates and low scratching tendencies after storage.

Suspending agents with suitable yield values include water-soluble carboxypolymethylene gums and xanthum gums. The carboxypolymethylene gums cause lower reductions in polishing rates than xanthum gums which provide the best suspension.

Dry powders of carboxypolymethylene gums may be prepared by the addition polymerization of acrylic acid or derivatives thereof in organic solvents. The polymer precipitates and is filtered off and dried to a powder.

Suitable carboxypolymethylene gums include the synthetic water-soluble non-linear resins sold by B. F. Goodrich Chemical Company under the trademarks Carbopol 910 and Carbopol 941. Carbopol 910 has a molecular weight of about 500,000 and Carbopol 941 has a molecular weight of about 1,000,000.

Xanthum gums are natural high molecular weight polysaccharides and suspend and stabilize aqueous slurries of the silica polishing agent. Xanthum gums are produced in a pure culture fermentation process by the microorganism *Xanthomonas campestris*.

A suitable xanthum gum is sold by Kelco Company under the trademarks Kelzan and Kelzan M. These polymers are complex natural polysaccharide gums having molecular weights of more than one million. The molecular weight of the polymer is probably in the order of 2 million but has been reported to be as high as 13–50 million.

Preferably, a silica aerogel is combined with the suspending agents to improve the storage stability of the slurries, especially at elevated temperatures of for instance about 100° C. A suitable silica aerogel is sold by the Davison Division of W. R. Grace & Co. under the trademark Syloid 266. Generally, the aerogel may have an average particle size of below four microns, for example, about one to about three microns; may be employed in amounts of from about 5 to about 10 parts by weight of aerogel per part by weight of the suspending agent and of from about 0.02 to about 0.05 parts by weight of the silica polishing agent.

The polishing compositions can be formulated as solid mixtures of the silica polishing agent and the suspending agent by mixing or grinding them together. The compositions can also be formulated as aqueous slurries containing generally about 2 to about 70 and preferably about 3 to about 30 percent of the silica polishing agent based on total weight of the slurry. The user of the composition will add water to a solid composition or may dilute a concentrated aqueous slurry to provide a polishing slurry of the desired concentration and consistency.

The amount of the suspending agent employed is that required to provide aqueous alkaline slurries having the desired concentration of silica polishing agent that meet the user's requirements for storage stability and pumping and polishing rates. An amount of the suspending agent of as little as about 0.3 percent by weight of the polishing agent and preferably from about 0.5 to about 30 percent by weight of the polishing agent is used in a solid composition for dispersion in water. Generally, the suspending agent comprises from about 0.1 to about 2 percent based on the total weight of the slurry.

Preferably, the polishing slurries in accordance with this invention contain an alkaline compound in an amount sufficient to provide a pH of at least about 7 and preferably of at least about 10. When the polishing is accomplished at an alkaline pH, a better quality planar surface is obtained and the polishing rate is higher. The pH values from about 10 to about 12 are especially preferred for optimum surface quality characteristics. Depending on the alkalinity of the compound, practical polishing rates may be obtained employing amounts ranging from about 0.05 to about 50 percent of the total weight of the slurry. The pH of the slurries may slowly decrease during storage over several weeks but a further amount of the alkaline compound may be added before use.

As the alkaline compound, any compound that is sufficiently alkaline in water to provide the desired pH and that is compatible with the suspending agents may be used. Suitable water-soluble alkaline compounds include sodium hydroxide, potassium hydroxide, ammonium hydroxide, sodium carbonate, sodium phosphate, and the like. Preferably, a water-soluble organic amine base such as triethylamine, triethanolamine, monoethanolamine, diisopropanolamine, ethylene diamine, and the like is employed. Generally, any water-soluble aliphatic amine base containing from about 1 to about 6 carbon atoms may be used. Ethylene diamine is especially preferred because it provides rapid polishing rates and disperses the silica polishing agent in the slurry.

The polishing is carried out by applying the aqueous slurry of the polishing composition to the silicon or germanium surface and then polishing with a polishing pad. Bowl feed and other commercially available polishing or lapping machines may be used. If desired, the surface may first be polished with a coarse abrasive and the finishing done with the polishing slurry of this invention. The pressure and speed of the polishing wheels and the polishing time are selected by the user to provide the degree of surface perfection required.

This invention is illustrated by the following example.

EXAMPLE 1

Washed silica hydrogel having a total volatiles content on ignition of 65–70 weight percent was ground in a MikroPul ACM-10 mill RG Jan. 13, 1978 to an average particle size of 6.5 microns. The total volatiles content on ignition of the ground hydrogel was 58 weight percent.

A concentrated slurry was prepared by mixing the ingredients for about 20 minutes in a tank using a high shear blade in the order listed in Table 1.

TABLE 1

| Ingredient | Amount |
| --- | --- |
| Water | 37.9 lbs. |
| Ethylene Diamine | 5.6 lbs. |
| Silica hydrogel | 53.6 lbs. |
| Syloid 266 | 2.6 lbs. |
| Carbopol 941 | 0.3 lbs. |

After 7 weeks of storage, the concentrated slurry was diluted with water to form a polishing slurry having a silica hydrogel content of 10 weight percent. The polishing slurry had a pH of 10.8.

The polishing effectiveness of the slurry on P-type silicon wafers having a 7–10 resistivity was determined using a Speedfam Mode 32 G polisher having a 32 inch wheel and four spindles with eight wafers per spindle. The feed rate of the slurry dripping onto the polishing pad was 250 cubic centimeters per minute (4 gallons per hour) and the pressure on the wafers was 3.9 pounds per square inch. The temperature of the pad during the polishing ranged from about 90° to about 100° F.

The average stock removal rate for several runs was 4.0 mils per hour (1.7 microns per minute) and the wafers were not scratched by the polishing.

What is claimed is:

1. A composition for polishing silicon and germanium comprising a silica hydrogel polishing agent having an average particle size of from about 1 to less than about 30 microns and from about 0.5 to about 30 percent by weight of the polishing agent of a suspending agent selected from the group consisting of water-soluble carboxypolymethylene gums and xanthum gums.

2. The composition of claim 1 further comprising water in an amount to form a polishing slurry and a water-soluble organic amine base in an amount sufficient to provide a pH of at least about 10.

3. The composition of claim 1 in which the polishing agent has an average particle size of from about 1 to about 15 microns.

4. The composition of claim 1 in which the polishing agent is a silica hydrogel containing at least about 50 weight percent water.

5. The composition of claim 4 in which the silica hydrogel contains from about 55 to about 75 weight percent water.

6. The composition of claim 4 further comprising a silica aerogel having an average particle size of below four microns in an amount of from about 5 to about 10 parts by weight per part by weight of the suspending agent.

7. The composition of claim 4 further comprising a silica aerogel having an average particle size of from about one to about three microns in an amount of from about 0.02 to about 0.05 parts by weight of the polishing agent.

8. The composition of claim 1 further comprising water in an amount to form a polishing slurry and an alkaline compound in an amount sufficient to provide a pH of at least about 10.

9. The composition of claim 8 in which the alkaline compound is present in an amount sufficient to provide a pH of from about 10 to about 12.

10. The composition of claim 8 in which the alkaline compound is a water-soluble aliphatic amine base containing from about 1 to about 6 carbon atoms.

11. The composition of claim 8 in which the alkaline compound is ethylene diamine.

12. The composition of claim 8 in which the alkaline compound comprises from about 0.05 to about 2 percent on the total weight of the slurry.

13. The composition of claim 8 in which the polishing agent comprises from about 3 to about 30 percent based on the total weight of the slurry.

14. The composition of claim 8 in which the suspending agent comprises from about 0.1 to about 2 percent based on the total weight of the slurry.

15. A method for polishing silicon and germanium which comprises applying to a surface of the silicon or germanium an aqueous slurry of a polishing composition comprising a synthetic amorphous silica polishing agent selected from the group consisting of silica hydrogel, silica aerogel, silica xerogel, and precipitated silica and having an average particle size of from about 1 to less than about 30 microns and a suspending agent selected from the group consisting of water-soluble carboxypolymethylene gums and xanthum gums and polishing the surface therewith.

16. The method of claim 15 in which the synthetic amorphous silica polishing agent has an average particle size of from about 1 to about 15 microns.

17. The method of claim 15 in which the synthetic amorphous silica polishing agent is a silica hydrogel containing at least about 50 weight percent water.

18. The method of claim 17 in which the silica hydrogel contains from about 55 to about 75 weight percent water.

19. The method of claim 15 in which the suspending agent comprises from about 0.5 to about 30 percent by weight of the polishing agent.

20. The method of claim 17 in which the polishing composition further comprises a silica aerogel having an average particle size of below four microns in an amount of from about 5 to about 10 parts by weight per part by weight of the suspending agent.

21. The method of claim 17 in which the polishing composition further comprises a silica aerogel having an average particle size of from about one to about three microns in an amount of from about 0.02 to about 0.05 parts by weight of the polishing agent.

22. The method of claim 15 in which the slurry further comprises an alkaline compound in an amount sufficient to provide a pH of at least about 10.

23. The method of claim 22 in which the alkaline compound is present in an amount sufficient to provide a pH of from about 10 to about 12.

24. The method of claim 22 in which the alkaline compound is a water-soluble organic amine base.

25. The method of claim 24 in which the synthetic amorphous silica polishing agent is a silica hydrogel and the suspending agent comprises from about 0.5 to about 30 percent by weight of the polishing agent.

26. The method of claim 24 in which the alkaline compound is a water-soluble aliphatic amine base containing from about 1 to about 6 carbon atoms.

27. The method of claim 22 in which the alkaline compound is ethylene diamine.

28. The method of claim 22 in which the alkaline compound comprises from about 0.05 to about 2 percent based on the total weight of the slurry.

29. The method of claim 22 in which the polishing agent comprises from about 3 to about 30 percent based on the total weight of the slurry.

30. The composition of claim 1 in which the suspending agent is a carboxypolymethylene gum.

31. The composition of claim 1 in which the suspending agent is a xanthum gum.

32. The method of claim 15 in which the suspending agent is a carboxypolymethylene gum.

33. The method of claim 15 in which the suspending agent is a xanthum gum.

* * * * *

UNITED STATES PATENT AND TRADEMARK OFFICE
CERTIFICATE OF CORRECTION

PATENT NO. : 4,260,396
DATED : April 7, 1981
INVENTOR(S) : Rimantas Glemza

It is certified that error appears in the above–identified patent and that said Letters Patent are hereby corrected as shown below:

Column 2, lines 21 and 22, delete "RG Jan. 13, 1978".
Column 2, line 34, delete "hydrogen" and insert therefor "hydrogel".
Column 4, line 62, delete "RG Jan. 13, 1978".
Column 5, claim 12, line 68, before "on" insert --based--.

Signed and Sealed this

Thirtieth Day of June 1981

[SEAL]

Attest:

RENE D. TEGTMEYER

*Attesting Officer*   *Acting Commissioner of Patents and Trademarks*